United States Patent [19]

Hancock et al.

[11] Patent Number: 5,195,417
[45] Date of Patent: Mar. 23, 1993

[54] REGISTRATION OF ARTWORK PANELS IN THE MANUFACTURE OF PRINTED CIRCUIT BOARDS

[75] Inventors: Stephen H. Hancock, Tequesta; Aaron L. Arnold, Palm Beach Gardens; Daniel R. Leiwe, Royal Palm Beach, all of Fla.

[73] Assignee: Northern Telecom Limited, Montreal, Canada

[21] Appl. No.: 514,409

[22] Filed: Apr. 26, 1990

[51] Int. Cl.$^5$ .............. B26D 1/00; G01N 21/86; G01B 11/00
[52] U.S. Cl. .................................. 83/34; 83/412; 83/367; 83/620; 250/548; 356/401
[58] Field of Search .............. 356/399, 400, 401; 250/548; 414/754; 901/47; 29/833; 83/618, 620, 34, 412, 367

[56] References Cited

U.S. PATENT DOCUMENTS

| | | | |
|---|---|---|---|
| 3,797,342 | 3/1974 | Sekel | 83/620 |
| 4,440,080 | 4/1984 | Lyall | 356/399 |
| 4,755,053 | 7/1988 | Levinson et al. | 356/401 |
| 4,761,561 | 8/1988 | Fujiwara et al. | 250/548 |
| 4,808,832 | 2/1989 | Doggett | 356/401 |

Primary Examiner—Davis L. Willis
Assistant Examiner—K. P. Hantis
Attorney, Agent, or Firm—Foley & Lardner

[57] ABSTRACT

In the registration of artwork panels for the manufacture of printed circuit boards, each panel is located, in turn, above two target location areas. Targets are provided upon the panel and these targets are positioned over the target location areas. With light projected from the target location areas and through the panel around the targets, the positions of the location areas and targets are monitored, and the artwork panel is moved to dispose the targets in specific locations relative to datums. The panel is then registered in position prior to a processing step, e.g. the punching-out of registration holes.

15 Claims, 7 Drawing Sheets

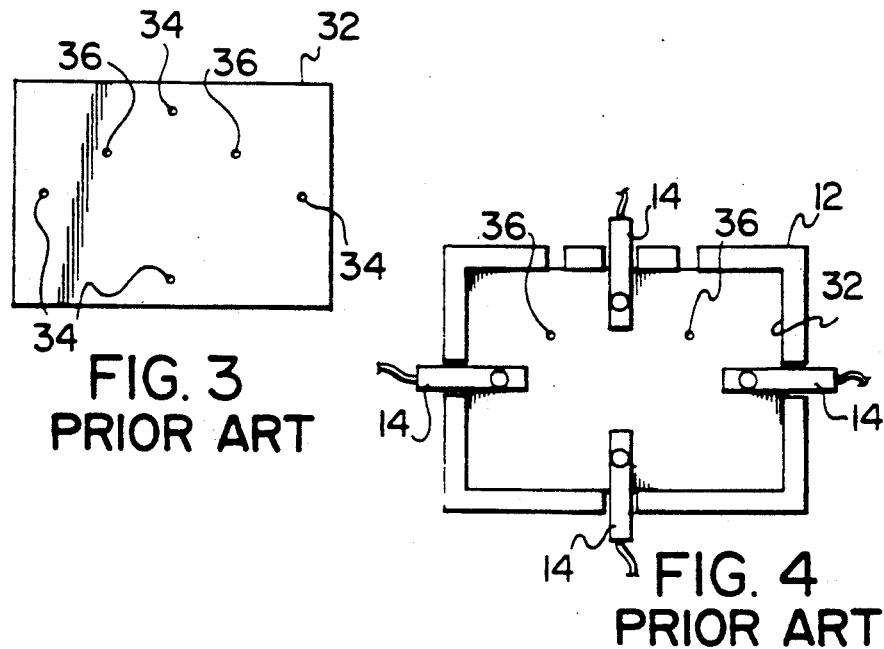
FIG. 3 PRIOR ART
FIG. 4 PRIOR ART
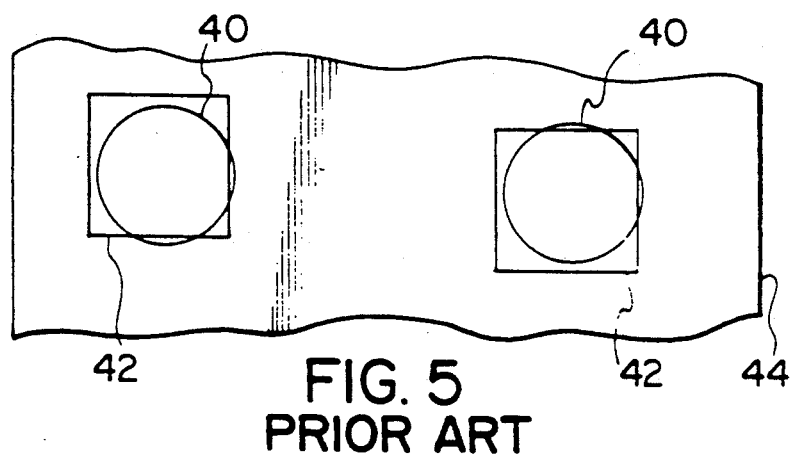
FIG. 5 PRIOR ART
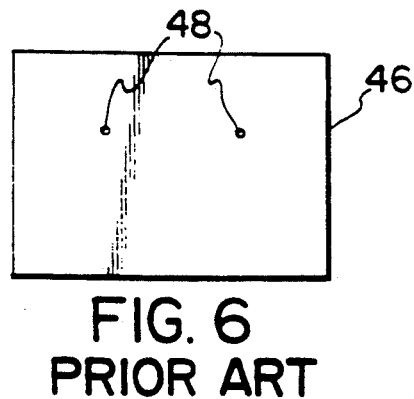
FIG. 6 PRIOR ART

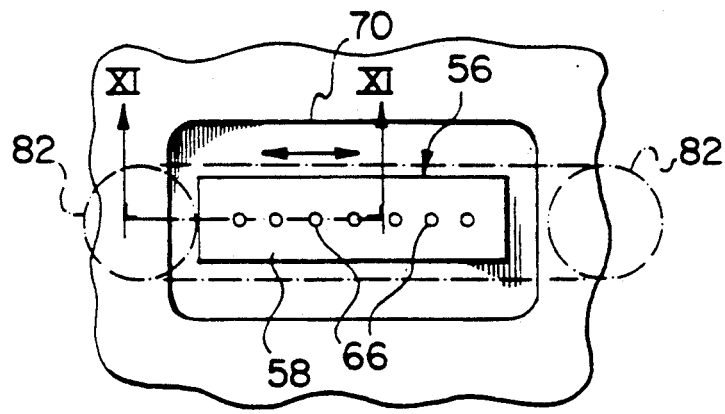
FIG. 10
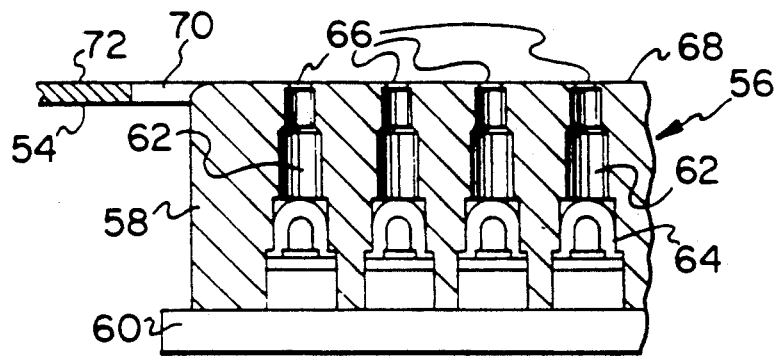
FIG. 11
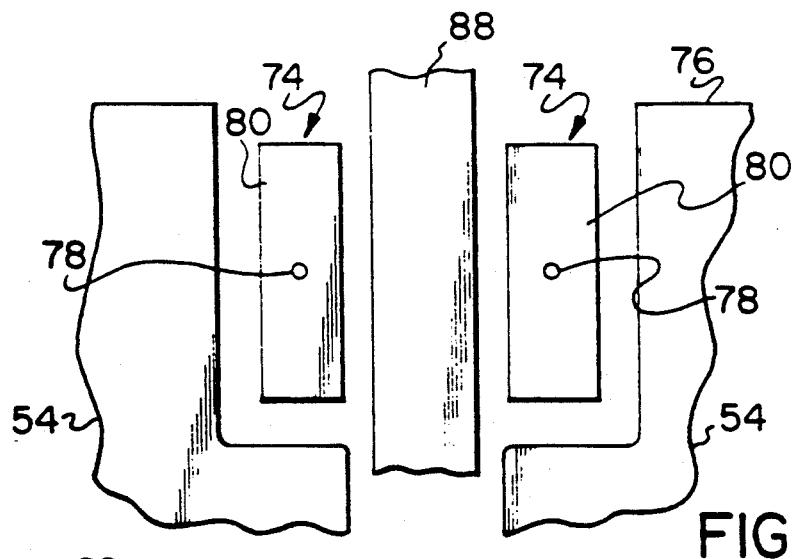
FIG. 12

REGISTRATION OF ARTWORK PANELS IN THE MANUFACTURE OF PRINTED CIRCUIT BOARDS

BACKGROUND OF THE INVENTION

1. Field of the Invention

This invention relates to the registration of artwork panels in the manufacture of printed circuit boards.

2. Discussion of the Related Art

Conventionally, an artwork panel is used for the preparation of an individual circuitry layer of a printed circuit board. As it is essential to attempt to obtain precise relative layer-to-layer positioning of the individual circuitry layers, the artwork panels for the layers need to be punched-out to provide registration holes which subject to operation error, are disposed in precisely predetermined locations relative to circuitry patterns on the artwork panels. In order to position the artwork panels preparatory to the punching operations, a support surface is provided directed towards which are overhead lights and at least two downwardly directed video cameras. A pre-punched panel is first placed upon the support surface and is adjusted in position until pre-punched areas of that panel are disposed in desired punching positions required for the artwork panels. The predetermined location of the pre-punched panel is obtained when punches of the apparatus are locatable simultaneously through each of the pre-punched holes in the pre-punched panel. With light reflected from the upper surface of the pre-punched panel, the cameras, movable horizontally in two directions normal to each other, are adjusted until they are vertically aligned above precisely positioned circular target holes provided upon the pre-punched panel. It is intended that the cameras will be vertically aligned above the target holes when camera images of the holes are positioned exactly symmetrically within video generated shapes upon video screens connected to the video cameras. The symmetrical positioning is judged visually by an operator who, when the video cameras are considered to be precisely in position to provide the desired symmetry, locks the video cameras in these positions which the cameras must maintain during punching of the artwork panels which is to follow.

The pre-punched panel is then removed and a first artwork panel to be punched is located upon the support surface. Each artwork panel has circular target patterns corresponding in position to the target holes in the pre-punched panel. The first artwork panel is moved upon the support surface in horizontal directions until its target patterns lie in required positions vertically beneath the cameras and in which the camera images of the patterns are judged visually to be positioned symmetrically within the video generated shapes upon the video screens. The first artwork panel is then considered to be positioned correctly for punching out the artwork panel in the predetermined locations. The punching operation then follows. The first artwork panel is then removed and the same judgmental location and following punching procedure takes place sequentially for all other artwork panels of the printed circuit board.

A problem which is inherent with the above procedure is that of quality control. As indicated above, the positioning of the pre-punched panel and of the artwork panels is judged visually. It has been shown that with visual assessment, the error in positioning each target relative to its exact desired position, both upon the pre-punched panel and upon the artwork panels may amount to ±0.003 inches. When it is considered that the error in positioning the pre-punched panel and any of the artwork panels may be in opposite directions from the exact desired position, then the error could be accumulative from artwork panel to artwork panel or there could be a resultant error between panels dependent upon an error in positioning of one panel in a direction at an angle to the directional error of another panel.

The above problem is augmented by changes in temperature and humidity of the artwork panels. Changes in temperature and humidity result in shrinkage or expansion of panels thereby changing the distance apart of their circular target patterns. As a result, it may be impossible to simultaneously align target patterns of any particular panel precisely with both video generated shapes on the video screens. The positioning of an artwork panel prior to punching then becomes more open to conjecture thereby enabling positioning errors to increase. A further problem is caused by the fact that as the cameras need to be adjusted in position initially over the pre-punched panel along both the 'x' and 'y' axes, then it is impossible to mount the cameras rigidly in position. Hence the cameras are subjected to slight vibrations which tend to change the positions of images upon the video screens, a positional change on the screens of course being magnified.

SUMMARY OF THE INVENTION

The present invention seeks to provide a method and apparatus in use of which errors in positioning and punching artwork panels may be reduced thereby enabling an improvement in quality of printed circuit boards formed from circuitry panels made by the use of such artwork panels.

Accordingly, the present invention provides a method of registering an artwork panel in position prior to a processing step comprising:- providing two spaced-apart target location areas upon a registration apparatus, the target location areas having different light emitting properties from surface areas surrounding the location areas; by light monitoring means, monitoring the positions of the spaced-apart target location areas and the positions of targets precisely located upon the artwork panel and simultaneously located over the target location areas with the artwork panel supported by a support means, the targets having different light emitting properties from artwork panel regions surrounding the targets; providing signals corresponding to the monitored positions of the target location areas and of the targets and analyzing the signals, to provide an analysis relating to the positions of the targets relative to precisely selected datums on the target location areas; and dependent upon said analysis, controllably moving the artwork panel on the support surface and relative to the target location areas while the positions of the targets continue to be monitored and analyzed so as to locate the two targets in specific locations relative to the precisely selected datums whereby the artwork panel is registered in position prior to the processing step.

It is envisaged that any light contrasting arrangement between the target location areas and their surrounding areas and between the targets and their surrounding areas will suffice consistent with being able to provide signals commensurate with monitoring the positions of the target location areas and of the targets. Thus, the target location areas and/or the targets could be lighter or darker than their surrounding areas. In certain ways of following the process according to the invention, the positions of the spaced apart target location areas may be monitored prior to placing the artwork panel upon the support surface. This would then require recording of first signals in a memory. This procedure then requires the positions of the targets to be subsequently monitored and further signals corresponding to the target positions compared with the first signals to evaluate the position of the targets relative to the precisely selected datums. It is, however, desirable for these two monitoring steps to be combined into one. This is effectively performed by providing the target location areas as lighter target location areas surrounded by darker areas and providing dark targets on the artwork panel surrounded by artwork regions which allow for passage of light. Thus, with the targets smaller than the target location areas, and with the targets directly disposed over the target location areas, light from the location areas is transmitted through the regions of the artwork panel surrounding the targets. Hence, positions and shapes of the location areas can be monitored through the artwork panel at the same time as the target positions are monitored. The positions of both may then be evaluated together by signals passed to a computer which provides a control for moving the artwork panel appropriately until the position of the targets are as desired relative to the precisely selected positions.

While the target location areas and targets may be of any practical shape, most desirably they are circular. Also, it is preferable to have target location areas provided by light shining through openings in a surface surrounded by an unlit surface, the light readily passing through a transparent or translucent target surround of the artwork panel.

The invention also includes apparatus for registering an artwork panel in position prior to a processing step comprising:- two spaced apart target location areas and surface areas of the apparatus surrounding the target location areas, the target location areas having different light emitting properties from said surface areas; support means for supporting the artwork panel with the artwork panel covering the target location areas, the support means being movable relative to the target location areas; light monitoring means for direction towards the target location areas for monitoring the positions of the target location areas and the positions of targets provided upon an artwork panel when supported by the support means with the targets simultaneously located over the target location areas; means for providing signals corresponding to the monitored positions of the target location areas and of the targets and for analyzing the signals, the analysis relating to the positions of the targets relative to precisely selected datums on the target location areas; and control means operable upon an analysis of signals indicating that the targets are located spaced from specific locations relative to the precisely selected datums, to controllably move the support means to locate the two targets in their specific locations so that the artwork panel is in a registered position relative to the apparatus.

In one arrangement, the target location areas are in fixed locations and the light monitoring means are in other fixed locations directed towards the location areas. With this construction the light monitoring means may be rigidly mounted upon the apparatus substantially to eliminate any vibrations of the light monitoring means which could affect the monitoring function. Alternatively, two groups of target location areas are disposed in fixed locations with a plurality of target location areas rectilinearly spaced apart in each group. In this case the light monitoring means for each group is movable solely along an axis to enable it to be selectively directed towards any target location area of its respective group. With the latter arrangement, and with the light monitoring means movable solely along one axis, then a support, such as a rigid beam, may be provided to ensure that the light monitoring means is rendered as stable as possible so as to minimize any vibrational tendencies.

With the method and apparatus according to the invention as defined above, the use of pre-punched panels is avoided and also any visual monitoring of the positions of the target is also avoided thereby avoiding any mistakes in positioning due to human error.

BRIEF DESCRIPTION OF THE DRAWINGS

One embodiment of the invention will now be described, with reference to the accompanying drawings, in which:

FIG. 3 is a plan view of a pre-punched panel for use in the apparatus of FIG. 1;

FIG. 4 is a view similar to FIG. 2 and showing the pre-punched panel of FIG. 3 registered precisely in position for the location of targets on the panel by video cameras;

FIG. 5 is a view showing the positioning of targets of the pre-punched panel within video generated shapes upon a video screen;

FIG. 6 is a plan view of an artwork panel to be punched upon the apparatus shown in FIG. 1;

FIG. 10 is a plan view of a target location region of the apparatus of the embodiment and to a larger scale than in FIG. 9;

FIG. 11 is a cross-sectional view taken along line XI—XI in FIG. 10 of that part of the apparatus;

FIG. 12 is a plan view of other target location regions of the apparatus of the embodiment and on the same scale as FIG. 10;

DETAILED DESCRIPTION OF THE PREFERRED

Figure 1:
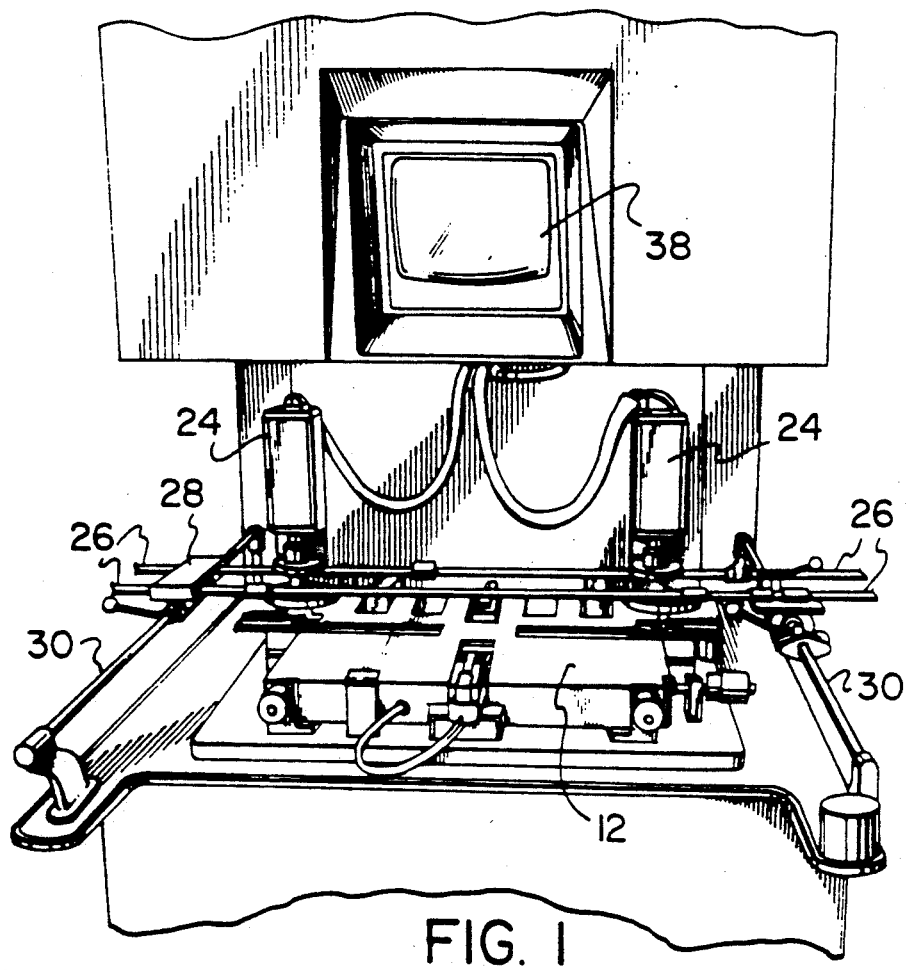
FIG. 1 is a perspective front elevational view of a conventional artwork panel registration and punching apparatus.
Figure 2:
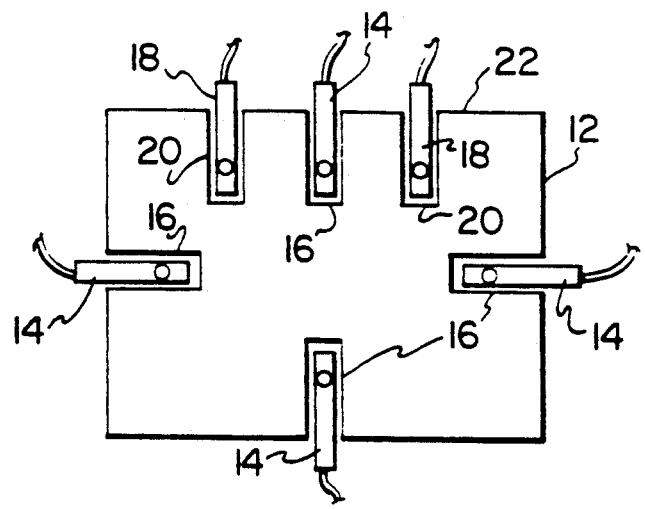
FIG. 2 is a plan view of a support surface and punching means of the apparatus of FIG. 1.

As shown in FIG. 1, a conventional apparatus for registering an artwork panel in the manufacture of printed circuit boards and for punching the panel in pre-selected areas comprises a horizontal planar support 12. The support 12 is movable in known manner, by means not shown, in horizontal directions 'x' and 'y' normal to each other and also is rotatable in a horizontal plane. As is more clearly shown by FIG. 2, the support 12 has six slots inwardly extending from outer edges of the support and punches for punching the artwork panels are located within the slots for the purpose of punching the panels. In particular, four punches 14 are set into recesses 16 at each of the four edges of the support and are equally spaced between the ends of the support. Two further punches 18 are provided at a rear of the table and extend into the further slots 20 which lie either side of the slots 16 at the rear face 22 of the support. All of the punches 14 and 18 are mounted securely in position upon a framework of the apparatus 1? and the recesses 16 and 20 provide a clearance between the punches and the planar support 12 to enable movement of the support in the 'x', 'y', and rotational directions relative to the punches.

To enable artwork panels to be punched in pre-selected positions, the following procedure is necessarily followed upon the prior apparatus. Before registering any artwork panel in position upon the support 12, it is necessary to locate video cameras 24 in positions vertically above the positions which target areas on the artwork panels will occupy when mounted upon the support. For this purpose, two video cameras 24 are used as shown in FIG. 1. These two cameras being mounted vertically so as to be directed downwardly towards the support 12. The cameras are mounted for horizontal movement both in the 'x' and 'y' directions and for this purpose two mounting rails 26 slidably support the cameras for movement in the 'y' direction, the rails 26 being held spaced apart at their ends in carrier blocks 28 which are slidably mounted upon further rails 30 for movement of the cameras in the 'x' direction.

To position the cameras in their desired locations, a pre-punched panel 32 (FIG. 3) is required. This pre-punched panel which does not itself provide an artwork panel, has four pre-punched holes 34 spaced apart close to its periphery. These holes correspond in position exactly with the punches 14. The pre-punched panel 32 is located upon the planar support 12, as shown in FIG. 4, and is adjusted in position until each of the holes 34 is so disposed that each of the punches 14 may be passed through an individual hole 34 so as to locate the pre-punched panel 32 correctly in position. In FIG. 4, the punches 18 are omitted for clarity. With the panel in this position, target areas in the form of holes 36 in the pre-punched panel are obviously also located in fixed positions. The pre-punch panel 32 is dark compared to the upper surface of the support 12 so as to have different light emitting characteristics from the support 12.

With light directed downwardly onto the pre-punch panel 32 from a source not shown, the video cameras are moved along their 'x' and 'y' axes until they are deemed to be disposed vertically above the two target holes 36. The video cameras are then locked in these positions. The positioning of the cameras 24 is performed visually. The cameras transmit electrical signals corresponding to the monitored positions of the holes 36 to a video screen 38 (see FIG. 1). The video screen 38 is capable of showing images from both cameras simultaneously and the screen also shows video generated shapes within which representations of the positions of the holes 36 are also represented. Hence, as the cameras are positioned and locked in position above the target holes 36, then a circular image 40 which represents a respective hole 36 is caused to appear upon the screen 38. With the cameras held in position, each image is fixed in position upon the screen. Two video generated shapes 42 are also shown upon the screen as shown by FIG. 5. Each shape 42 is a square light area surrounded by a dark background 44 and is of such a size that when an image 40 is symmetrically inside it, each edge of the shape 42 forms a target to the circular edge of the image 40. Each video generated shape is manually adjusted in position upon the screen until a respective image 40, which is darker than the shape 42, appears to be centrally positioned within the shape 42.

It is an aim of the operator to dispose each shape 42 exactly concentrically around its image 40 to locate the shape 42 correctly in position as a guide for the artwork positioning which is to follow. However, the positioning procedure for the video generated shapes 42 is performed visually and depends on image resolution on the screen and on the operator's skill and also on his opinion as to the exact location of the shapes 42 around the images 40. It has been shown that human judgment of the positioning of the shapes 42 has resulted in an error in positioning of up to ±0.003 inches away from their true desired position. FIG. 5 in exaggerated form, shows one example of positioning error in which images 40 are not precisely centrally located within their video generated shapes 42.

After the cameras have been locked in position, the video generated shapes adjusted in position, and the pre-punched panel 32 has been removed, then each artwork panel 46 (FIG. 6) is disposed in turn upon the support 12 so as to be punched in desired positions. As can be seen from FIG. 6, each artwork panel is formed with two target patterns 48 in exactly the same relative positions as the target holes 36 on the pre-punched panel 32.

With the two cameras 24 located in their fixed positions, the first artwork panel 46 is located upon the support 12 and is moved manually by movement of the support in the 'x', 'y' and rotational modes so as to position the target patterns 48 beneath the cameras 24 whereby the images of the target patterns are represented upon the screen 38 in a similar manner to the target holes for the pre-punched panel. The artwork panel is then moved until each of the target patterns 48 is judged by the operator's eye to lie concentrically within its respective video generated shape 42. When the images of the target patterns 48 are judged by the operator to be correctly positioned, it is then assumed that the artwork panel 46 is registered for punching purposes and is secured in position to enable the punching operation to proceed. This punching operation may provide four punched holes formed by the punches 14 or three punched holes in series towards the rear face 22 and provided by the two punches 18 and the intermediate punch 14.

A problem which exists is that the judgment in visually registering the artwork panel correctly in position is subject to the same type of errors as are found with the registration of the video generated shapes 42 with the images 40. Not only is there a problem in registering the images of the target patterns 48 correctly within the video generated shapes 42, but also, at this point in the operation, it is assumed that the video generated shapes 42 themselves have previously been correctly located when, as has been shown above, an error in positioning may have already resulted through human error. As a result, therefore, the error in positioning of the artwork panel is an aggregate of the first error in positioning the video generated shapes 42 and any subsequent error in positioning of the images for the target patterns 48 within the generated shapes 42. This subsequent error is compounded because the distances apart of the target patterns 48 are subject to change dependent upon shrinkage or expansion of the artwork panel because of change in temperature conditions. Hence, it is highly likely that an operator will be presented with a situation in which it is absolutely impossible for the images of the target patterns 48 to lie simultaneously concentrically within the video generated shapes 42. In this case, the operator needs to use his judgment in attempting to locate the target patterns 48 equal distances away from the center of the generated shapes 42.

It follows therefore that a combination of errors in visual reading from the video screen 38 may position each artwork panel in a location which is a substantial distance away from that required prior to a punching operation. These errors are further compounded by the fact that the cameras 24 are mounted upon rails 26 and 30 as is necessary to ensure that the cameras move in both the 'x' and the 'y' directions. Unfortunately the rails 30 and 26 are provided simply as guides and may be vibrated relatively easily by vibrations within buildings. It is not unknown for the camera images upon the screen 38 to be displaced from the positions required by vibrational movement of the cameras taking place between initial fixing of the cameras in position and their use for locating the artwork panels in their registered positions. Subsequent artwork panels may have been subjected to different temperature and humidity conditions and hence the target patterns 48 may be slightly different distances apart from one panel to another. This detracts from a correct positioning of each artwork panel in turn upon the support 12. As this positioning is always subject to visual interpretation then it is quite possible that when the punched holes in succeeding artwork panels are correctly aligned, then the artwork panels themselves are not correctly registered from one panel to another.

Figure 7:
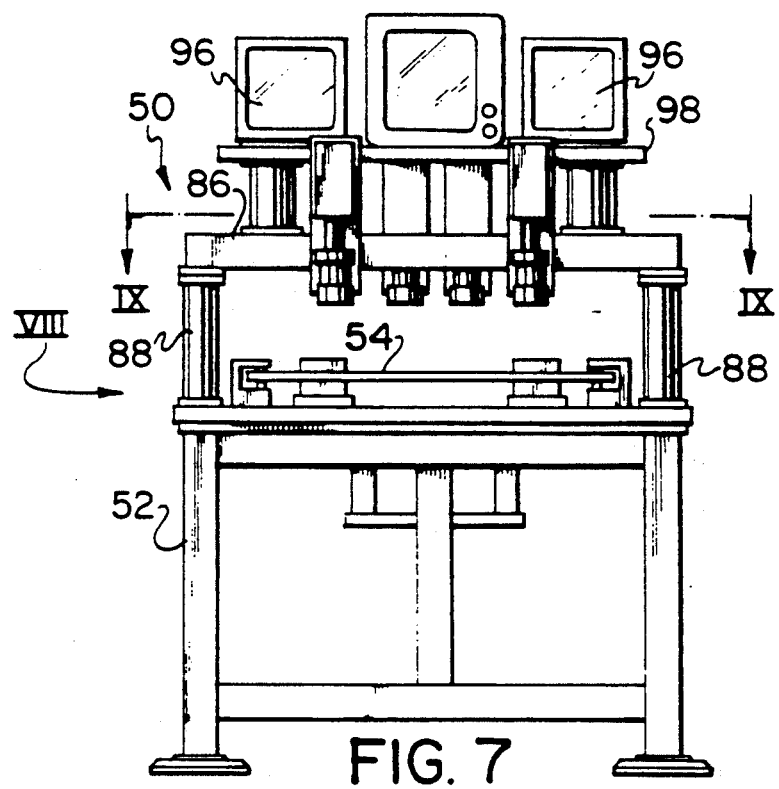
FIG. 7 is a front elevational view of an apparatus for registering an artwork panel in position prior to a punching operation.

As will be shown by the present embodiment from FIG. 7 onwards, the above disadvantages in registering the artwork panels are minimized. Also registration of the artwork panels is performed while avoiding the use of a pre-punched panel such as is used with the prior art.

Figure 8:
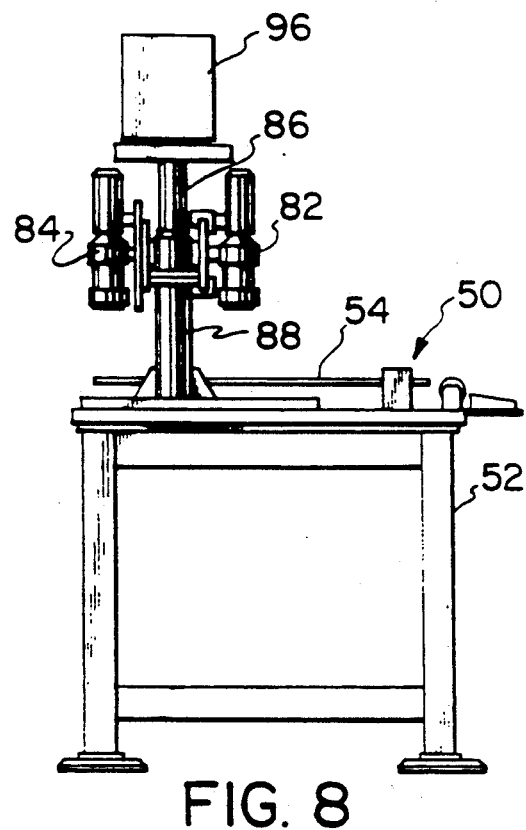
FIG. 8 is a side elevational view in the direction of arrow VIII in FIG. 7 of the apparatus of the embodiment.
Figure 9:
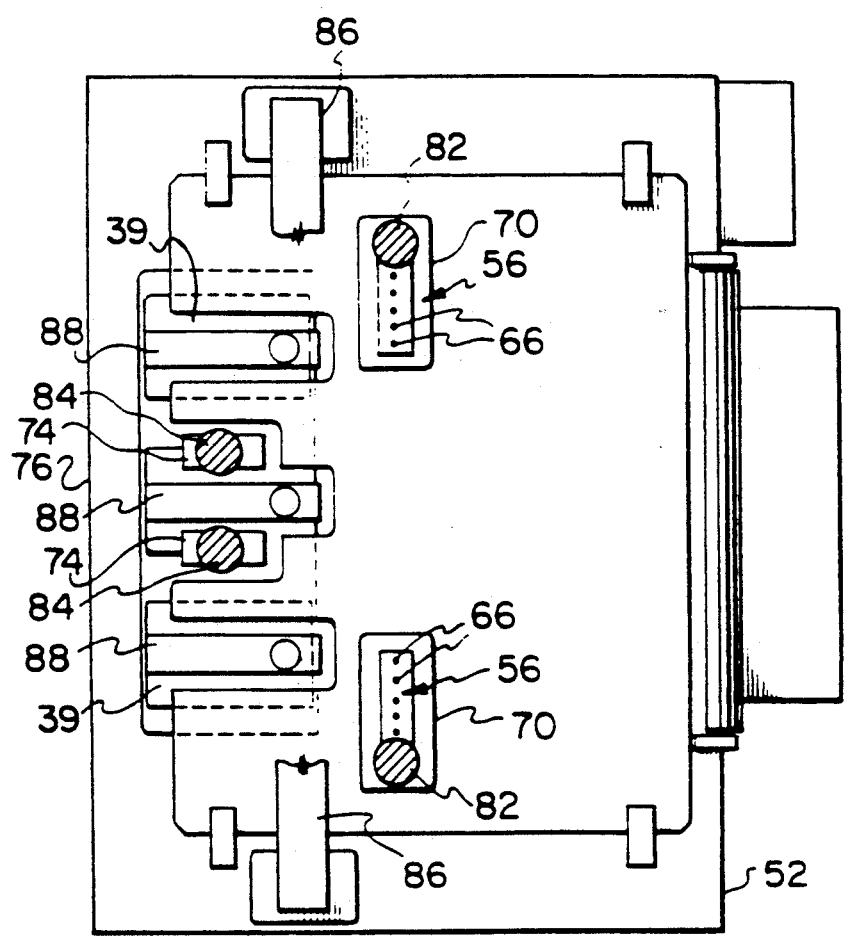
FIG. 9 is a cross-sectional view taken along line IX—IX of the apparatus of FIG. 7 and to a larger scale.

As shown generally by FIGS. 7, 8 and 9, in the embodiment, an apparatus 50 for registering an artwork panel in position prior to a punching operation comprises a stand 52 which carries a planar support or horizontal platen 54 which is movable horizontally in 'x' and 'y' directions and is also rotatable in a horizontal plane. The x, y and rotational movements are provided by screw-threaded drive shafts and a rotatable table disposed beneath the platen and provided by a control means. Such a mechanism for moving the platen is conventional and may be similar to that described with reference to the prior art in FIGS. 1 to 6 and need be described no further.

Two target location area members 56 (FIG. 9) are disposed in fixed positions upon the stand 52 towards the opposite sides of the platen 54. Each target location area member 56 comprises a housing 58 (see particularly FIGS. 10 and 11) which extends upwardly from a base 60, the housing formed with vertically extending cavities 62 which house towards their lower ends a light emitting means in the form of light emitting diodes 64. Light from the diodes 64 is emitted upwardly through target location areas, i.e. openings 66 to the cavities, the openings being provided at a top surface 68 of the housing 58 and being of circular configuration as shown in FIG. 10. The target location area members 56 are relatively positioned, and the cavities 62 are arranged in each housing 58 so that the openings 66 in each housing are in a rectilinear array as shown in FIG. 10 and the two rectilinear arrays are aligned from one housing to the other as shown in FIG. 9. Each opening 66 provides a circular target location area which is surrounded by upper surface areas of the top surface 68 of the housing 58, these surface areas being darker and thus having different light emitting properties from the openings 66 when light from the LEDs 64 is shining through them.

As shown in FIG. 11, the housings 58 extend upwardly from beneath the platen 54 and project into rectilinear openings 70 in the platen so that the top surface 68 of each housing 58 is substantially coplanar with or lies slightly below the support surface 72 of the platen. As shown by FIG. 10, the rectilinear openings 70 provide a clearance between the platen and the housing 58 so as to allow for horizontal movement of the platen in the x, y and rotational senses with the target location area members 56 remaining stationary on the stand 52.

The apparatus 50 is also provided with two further target location area members 74 (see FIG. 9) which are located towards a rear 76 of the platen 54. The target location area members 74 are similar in construction to the target location area members 56 except that each target location area member 74 is provided with a single cavity 75 in its housing 77, the cavity 75 similar to a cavity 62, and a single light emitting diode 79 is provided which emits light upwardly through the cavity and from an opening 78 in a housing 80 (see FIGS. 12 and 14). The target location area members 74 are also securely mounted in fixed positions upon the stand 52 and the upper surface of each housing 80 is coplanar with or slightly below the support surface 72 of the platen 54.

The apparatus 50 is further provided with light monitoring means for direction towards the target location members so as to monitor positions of the openings 66 and 78 and position of targets provided upon an artwork panel as will be described. The light monitoring means comprises two forwardly disposed video cameras 82 and two rearwardly disposed video cameras 84. A rigid immovable beam structure 86 is provided for supporting all of the cameras. This rigid beam structure is rigidly secured to two upwardly extending rigid columns 88 (FIGS. 7 and 8) of the stand 52 with the beam structure 86 extending in a spaced position horizontally across the platen 54 so as to project beyond the sides of the platen. The beam structure 86 therefore effectively forms part of the rigid structure of the stand 52 and is immovable for any movement required for any of the cameras carried by the beam structure. Because of the rigidity of the beam structure, any vibrational tendency of the structure is minimized.

The beam structure 86 provides a guide for sliding movement of each of the forwardly disposed video cameras 82 in a sideways direction across the platen. Each camera 82 is associated with a respective target location area member 56 and is movable horizontally as shown by FIG. 10 at least between the two chain-dotted outline positions 83 so that the camera may be disposed vertically above and to receive light from any chosen opening 66 in a respective housing 58. A manually operable locking mechanism (not shown) is employed to securely fix each camera 82 to the beam 86 in any desired position along the length of the structure 86. The degree of security of the cameras 82 to the beam structure 86 is such that the rigidity of the structure is conveyed to the cameras themselves so as to minimize any vibrational movement of the cameras which may take place due to vibration of the floor carrying the apparatus 50.

The rearward video cameras 84 are secured in a fixed position to the rear of the beam structure 86; no movement of the cameras 84 is required nor is it necessary as these cameras are permanently trained in a vertical direction so as to receive light from the openings 78 in the housings 80 of the target area means 74. Thus the cameras 84 are also rigidly held in position so as to minimize any vibration.

The apparatus 50 is also provided with three punches of conventional construction, these punches 88 lying side-by-side in spaced positions and being accommodated with clearance in slots 89 provided from the rear of the platen 54. The intermediate platen 88 lies spaced symmetrically between the target location area members 74 (see particularly FIG. 12).

Figure 15:
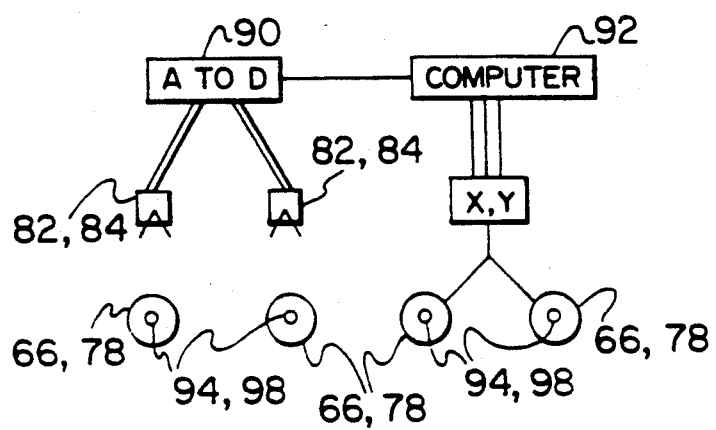
FIG. 15 is a diagrammatic representation or block diagram of a visual monitoring means and control means for registering an artwork panel upon the support surface.

The apparatus includes means for providing signals corresponding to monitored positions of the target location areas, i.e. the openings 66 and 78 relative to the cameras and of the targets relative to the target location areas and for analyzing the signals. This signal provision means includes an analog to digital converter 90 (FIG. 15) which is electrically connected to each of the cameras 82 and 84 to receive analog signals therefrom. The converter 90 is also connected to a computer 92 to which it is capable of transmitting digital signals converted from the analog signals. Computer 92 is capable of analyzing the respective signals to determine the positions of the targets relative to the target location areas, i.e. the openings 66 and 78 in the housings 58 and 80. More precisely, the computer 92 is capable of setting a precisely selected datum point on each of the target location areas (the openings 66 and 78) upon which the cameras are trained and for determining the positions of the targets relative to those registration points. For convenience, these registration points are the centers of generation of the circular openings 66 and 78.

Further, the computer forms part of the control means for providing movement in the horizontal directions of the stand 52. The computer issues commands dependent upon the analysis of the signals indicating that the targets are spaced from their specific locations relative to the centers of generation of the openings 66 and 78 so as to cause movement of the platen in the 'x', 'y' or rotational senses so as to move an artwork panel carried thereby into its desired registration position.

In use of the apparatus 50 an artwork panel may be punched in three spaced positions by all of the punches 88 simultaneously towards a rear edge of the artwork panel or alternatively, the center punch 88 may be used for punching a single hole towards each edge of the panel in turn.

Figure 13:
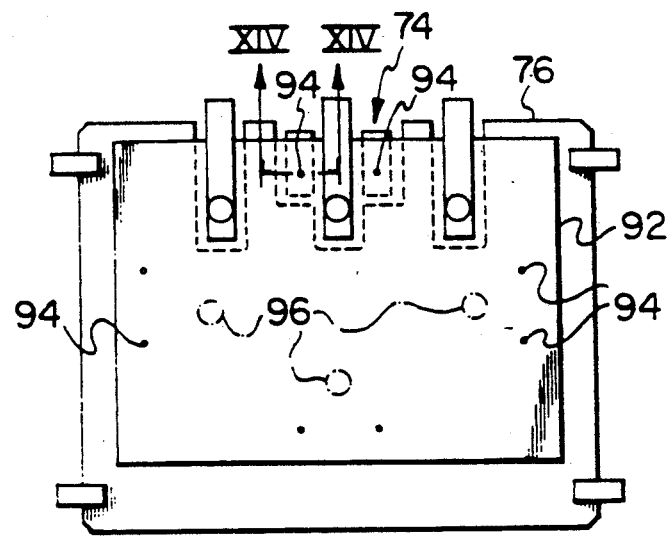
FIG. 13 is a plan view of a support surface of the apparatus of the embodiment, and to the same scale as FIG. 7, and showing an artwork panel during its location in a registered position prior to a punching operation.

For the purpose of using the center punch 88 for forming four holes in an artwork panel 92 (see FIG. 13) the artwork panel is provided with four pairs of targets 94, the targets of each pair being spaced apart towards a respective edge of the panel 92. The targets 94 are precisely located in position upon the artwork panel by a laser etching operation which forms the targets as dark areas surrounded by translucent or transparent regions of the panel in the immediate vicinity of the targets. As can be seen by FIG. 13, the panel is located for a first punching operation with one pair of the targets 94 disposed over the target area means 74. The targets 94 of each pair are spaced the same distance apart as the openings 78 of the housings 80. Therefore, when the panel 92 is located precisely in its registration position for punching then each target 94 should be disposed concentrically over an opening 78.

The panel 92 is held upon the platen 54 by conventional vacuum applying means through the platen (not shown). The rearward video cameras 84 monitor the positions of the targets 94 disposed beneath them and also the positions of the openings 78 which are overlain by the panel 92, the light from the openings 78 passing through the translucent or transparent material of the panel surrounding the targets. This monitored information is conveyed simultaneously for the position of the opening 78 and for the targets 94 through the converter 90 to the computer in which the signals are analyzed so that the computer can determine the relative positions of the targets and the selected datum points on the openings 78. If either of the target areas 94 is not concentrically located with respect to its opening 78 then the computer control operates to move the platen 54 in the 'x', 'y' or rotational senses until both of the targets are precisely registered with the datum points of the openings 78 within the operating capabilities of the computer. The relative positions of the targets 94 and video generated shapes corresponding to the openings 78 are shown upon two video screens 96 carried upon a platform 98 supported by the beam structure 86 (FIG. 7).

Figure 14:
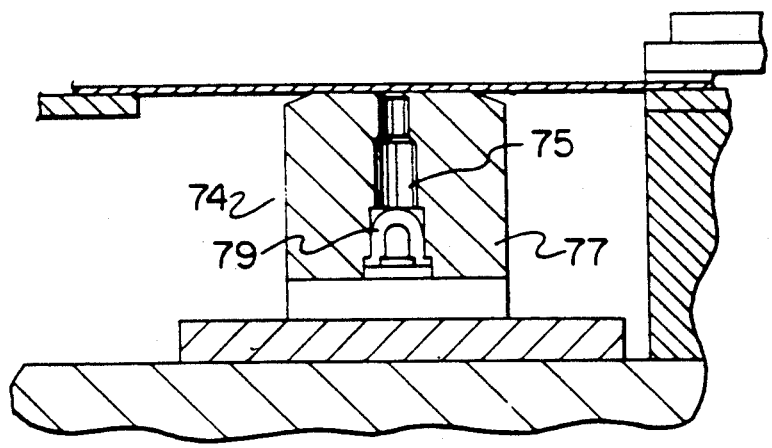
FIG. 14 is a cross-sectional view taken along line XIV—XIV in FIG. 13 and on an enlarged scale.

As soon as the computer has determined that the targets 94 are disposed in their correct positions relative to the illuminated openings 78, then movement of the platen 54 ceases as the artwork panel 92 is in its registration position for a punching operation as shown by FIG. 14. This punching operation, which merely involves the center punch 88, may then be performed manually or automatically by computer control.

The above operation upon the artwork panel 92 is then repeated three more times so as to align each of the pairs of the targets 94 with the illuminated openings 78 for the provision of a punched hole in four places in the artwork panel as shown by the chain-dotted outlines 96 in FIG. 13.

With the apparatus according to the embodiment operating in the manner described, it has been found that the error in positioning of the targets 94 on the illuminated openings 78 has been minimized so that the artwork panel is substantially correctly registered before a punching operation. In fact, it has been shown that the apparatus performs with an accuracy such that the targets lie at a maximum of 0.0002 inches away from their registration points.

Hence the apparatus operates to provide punched holes in an artwork panel with a high degree of accuracy thereby ensuring that this high degree of accuracy is transmitted to the individual circuitry layers from which a printed circuit board is to be made. It follows that error in relative location of circuitry layers is rendered negligible while providing a high degree of quality control to the finished product.

Figure 17:
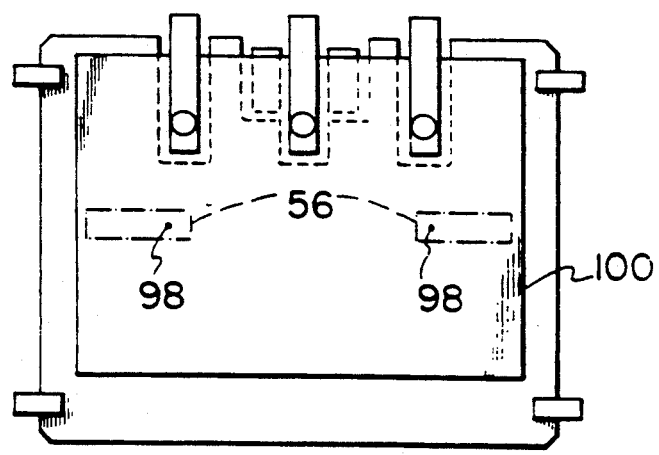
FIG. 17 is a view similar to FIG. 13 of an artwork panel being registered in position for a different punching operation.

The apparatus 50 may also be used for forming three punched holes simultaneously by the simultaneous operation of the three punches 88. This operation is performed as shown in FIG. 17, by having two targets 98 only upon an artwork panel 100. These targets are positioned so as to lie above the target location area members 56 and are positioned a distance apart dependent upon the width of the particular artwork panel.

With the artwork panel 100 positioned as shown in FIG. 17, the two targets 98 lie above two illuminated target area openings 66 of the housings 58. The cameras 82 are moved along the beam structure 86 until they are vertically disposed above the targets 98 and the respective illuminated openings 66, at which time the cameras 82 are locked rigidly in position to the beam structure. The positions of the targets 98 relative to the datums, i.e. centers of generation of the illuminated openings 66 are then monitored by the cameras 82 and signals are sent through the converter 90 to the computer 92 so as to control the movement of the platen 54 and the panel 100 in a manner similar to that described above for the targets 94. The three punches 98 operate to simultaneously provide the three punched holes in the panel 100 when the panel is registered correctly in position as dictated by the positions of the targets relative to their illuminated openings 66.

The above apparatus may operate slightly differently in that the respective cameras may be used to monitor the positions of the target location areas before an artwork panel is positioned upon the platen 54. If the target location areas are monitored in this way, then signals relating to these positions must be fed to a memory means and subsequent signals relating to the targets are also fed to the memory means so that the required analysis may then take place.

Figure 16:
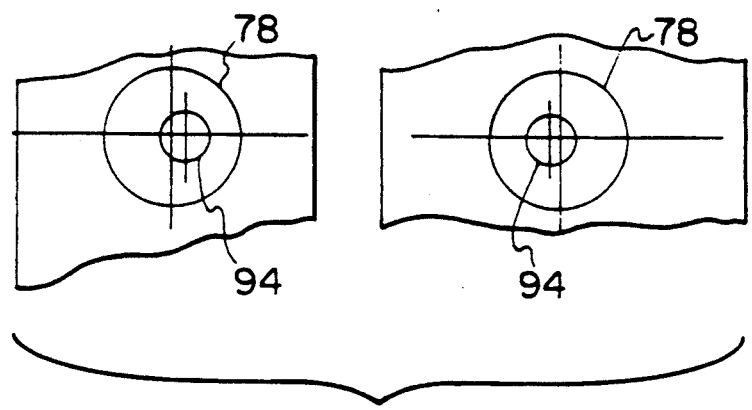
FIG. 16 is a view similar to FIG. 5 of targets shown upon video generated shapes in relation to an artwork panel being registered upon the apparatus of the embodiment.

The above apparatus operates successfully for registering panels in position when the distance between the targets exactly corresponds to the distance between the selected datum points on the target location areas. In addition, the apparatus deals successfully with artwork panels which, because of temperature or humidity conditioning leading to expansion or contraction of the panels, have their targets positioned at distances slightly different from the selected datum points on the target location areas. In this case, the monitored signals are transmitted to the computer which, through its software is capable of recognizing the disparity in the measurements between targets and target location areas and is capable of disposing the panel in a registered position. This is effected while compensating for the disparity measurement by providing a degree of symmetry between one target area and its selected datum point and that of the other target area and its datum point. This type of situation is illustrated in FIG. 16 in which it can be seen that with an artwork panel located in its registered position, each of the targets 94 as shown by the video monitor screens, is spaced substantially the same distance from the centers of generation of the video generated shapes 78 so as to centralize a contracted panel in which the targets lie closer together than the centers of the illuminated openings 78.

What is claimed is:

1. A method of registering an artwork panel in position and then of punching a registration hole in the artwork panel comprising:
   providing two spaced apart groups of target location areas in fixed locations upon a registration apparatus, the target location areas having light emitting properties which are different from light emitting properties of surface areas surrounding the target location areas, the target location areas in each group being rectilinearly spaced apart along a desired axis;
   providing a light monitoring means for each group of target location areas, each light monitoring means being movable along an axis enabling it to be selectively directed towards any chosen target location area within the respective group;
   directing each light monitoring means towards the chosen target location area;
   monitoring the positions of the chosen target location areas and the positions of targets which are precisely located upon the artwork panel and located over the chosen target location areas, wherein the artwork panel is supported by a support means, and the targets have different light emitting properties from artwork panel regions surrounding the targets;
   providing signals corresponding to the monitored positions of the chosen target location areas and of the targets and analyzing the signals to provide an analysis relating to the positions of the targets relative to precisely selected datums on the chosen target location areas;
   dependent upon said analysis, controllably moving the artwork panel on the support means relative to the chosen target location areas while the positions of the targets continue to be monitored and analyzed so as to locate the two targets in specific locations relative to the precisely selected datums whereby the artwork panel is registered in position prior to punching; and
   then punching the registration hole in the artwork panel at a permanently fixed location relative to the target location areas.

2. A method according to claim 1 further comprising the steps of:
   simultaneously monitoring the positions of the chosen target location areas and of the targets to provide signals indicative of the positions of the targets and of the chosen target location areas;
   precisely selecting the datums on the chosen target location areas;
   and then controllably moving the artwork panel to locate the two targets in their specific locations relative to the precisely selected datums so as to register the artwork panel in position prior to the processing step.

3. A method according to claim 2 further comprising the steps of:
   providing each target location area as an opening to a cavity, the openings facing upwardly with the surface areas surrounding the openings;
   passing light upwardly from each of the openings;
   with the artwork surrounding the targets, allowing the passage of light from the openings, and locating the artwork panel upon a support surface with the targets simultaneously located over the chosen target location areas, whereby light from the openings pass through the artwork panel regions;

and then simultaneously monitoring the positions of the chosen target location areas and of the targets.

4. A method according to claim 1 further comprising the steps of:

monitoring the positions of the chosen target location areas and providing first signals corresponding to the monitored positions of the chosen target location areas;

locating the artwork panel upon the support means with the targets simultaneously located over the chosen target location areas;

monitoring the positions of the targets and providing second signals corresponding to the monitored positions of the targets;

analyzing the second signals together with further signals derived from the first signals and representative of precisely selected datums on the chosen target location areas to determine the positions of the targets relative to the precisely selected datums; and then controllably moving the artwork panel to locate the targets in the specific locations relative to the precisely selected datums so as to register the artwork in position prior to the processing step.

5. A method according to claim 3 further comprising the step of:

providing the openings with a circular configuration and controllably moving the artwork panel relative to the chosen target location areas to locate the targets in specific locations relative to the precisely selected datums; wherein the precisely selected datums are datum points coinciding with the centers of generatrices of the openings.

6. Apparatus for registering an artwork panel in position and then of punching a registration hole in the panel comprising:

two spaced apart groups of target location areas and a surface area surrounding each target location area, the target location areas having different light emitting properties from said surface areas, and the target location areas in each group being rectilinearly spaced apart along a desired axis;

support means for supporting the artwork panel with the artwork panel covering the target location areas, the support means being movable relative to the target location areas;

means for monitoring light for each group of target location areas, each light monitoring means being movable along an axis to enable it to be selectively directed towards any chosen target location area within the respective group, wherein the two light monitoring means monitor the positions of the chosen target location areas and the positions of targets provided upon an artwork panel when the artwork panel is supported by the support means and the targets are simultaneously located over the chosen target location areas;

means for providing signals corresponding to the monitored positions of the chosen target location areas and of the targets and for analyzing the signals, whereby the analysis relates to the positions of the targets relative to precisely selected datums on the chosen target location areas;

means for controllably moving the support means which becomes operable upon an analysis of signals which indicates that the targets are located away from specific locations relative to the precisely selected datums and moves the support means to locate the targets in their specific locations whereby the artwork panel is in a registered position relative to the chosen target location areas; and means for punching the registration hole in the artwork panel at a permanently fixed location relative to the target location areas.

7. Apparatus according to claim 6 provided with target location area members formed with cavities, the target location areas formed by openings to the cavities at a surface of the target location area members, and with light transmitting means positioned within each of the cavities so as to emit light from the openings.

8. Apparatus according to claim 7 wherein the light transmitting means comprises a light emitting diode positioned within each cavity.

9. Apparatus according to claims 6, 7 or 8 wherein:

the light monitoring means is capable of simultaneously monitoring the positions of the chosen target location areas and of the targets when regions of the artwork panel surrounding the targets allow for the passage of light received from the openings; and the means for providing signals is capable of simultaneously providing signals corresponding to both the positions of the targets and of the chosen target location areas.

10. Apparatus according to claim 6 wherein each light monitoring means is mounted so as to be movable along a beam extending across and spaced from the support means, the beam rigidly attached to a rigid machine frame.

11. Apparatus according to claim 6 wherein the support means comprises a support surface and each target location area is directed through a space through the support means and through the support surface, the space providing a clearance between the target location area and the support means to enable the support means to be moved relative to the target location area.

12. Apparatus according to claim 6 wherein the support means is movable in a plane over the target location areas in 'x' and 'y' directions and is also rotatable in said plane.

13. A method of registering an artwork panel in position comprising:

providing a registration apparatus having two spaced apart target location areas provided as openings to cavities, the openings facing upwardly;

providing an artwork panel having dark targets and regions of the artwork panel which surround the targets, said regions having a light transmitting property;

locating the artwork panel upon a support surface with the dark targets simultaneously located over the openings, and transmitting light upwardly from the openings and through the regions of the artwork panel which surround the targets;

receiving the transmitted light in light monitoring means to monitor the positions of the targets relative to the target location areas;

providing signals corresponding to the monitored positions of the target location areas and of the targets and analyzing the signals to provide an analysis relating to the positions of the targets relative to precisely selected datums on the target location areas;

dependent upon said analysis, controllably moving the artwork panel on the support surface relative to the target location areas while the positions of the targets continue to be monitored and analyzed so as to locate the targets in specific locations relative to the precisely selected datums whereby the artwork panel is registered in position prior to a punching step; and then punching a registration hole in the artwork panel at a permanently fixed location relative to the target location areas.

14. Apparatus for registering an artwork panel in position and then of punching a registration hole in the panel comprising:

two spaced apart target location members formed with cavities and having target location areas formed by upwardly facing openings to the cavities; means for emitting light positioned within each of the cavities whereby light is emitted upwardly from the openings;

support means for supporting the artwork panel with the artwork panel covering the target location areas, the support means being movable relative to the target location areas, the target location areas being unobstructed by the support means;

light monitoring means for receiving light which is transmitted upwardly from the target location areas and through light transmittable material of the artwork panel when covering the target location areas, wherein the light monitoring means monitors the positions of the target location areas and the positions of targets provided upon the light transmissible material;

means for providing signals corresponding to the monitored positions of the target location areas and of the targets and for analyzing the signals, whereby the analysis relates to the positions of the targets relative to precisely selected datums on the target location areas;

means for controllably moving the support means, wherein the means for controllably moving the support means becomes operable upon an analysis of signals which indicates that the targets are located away from specific locations relative to the precisely selected datums and moves the support means to locate the two targets in their specific locations whereby the artwork panel is in a registered position relative to the chosen location areas; and means for punching the registration hole in the artwork panel at a permanently fixed location relative to the target location areas.

15. A method of registration artwork panels in position and then of punching a registration hole in each artwork panel comprising the steps of:

providing a registration apparatus having two spaced apart target location areas provided as openings to cavities, the openings facing upwardly;

providing a plurality of artwork panels each having dark targets and regions of the panel which surround the targets the regions having a light transmitting properly;

locating a first of the artwork panels upon a support surface with the dark targets simultaneously located over the openings, and transmitting light upwardly from the openings and through the regions of the first artwork panel which surround the targets;

receiving the transmitted light in light monitoring means to monitor the positions of the targets of the first artwork panel relative to the target location areas;

providing signals corresponding to the monitored positions of the target location areas and of the targets and analyzing the signals to provide an analysis relating to the position of the targets relative to precisely selected datum on the target location areas;

dependent upon said analysis, controllably moving the first artwork panel on the support surface relative to the target location areas while the positions of the targets continue to be monitored and analyzed so as to locate the targets in specific locations relative to the precisely selected datums whereby the first artwork panel is registered in position prior to the punching step;

punching the registration hole in the first artwork panel at a permanently fixed location relative to the target location areas; and repeating the location, registration and punching steps upon the remainder of the artwork panels in sequence with the punching operation at the permanently fixed location relative to the target location areas.

* * * * *